United States Patent
Subramanian et al.

(10) Patent No.: US 6,737,222 B2
(45) Date of Patent: May 18, 2004

(54) DUAL DAMASCENE PROCESS UTILIZING A BI-LAYER IMAGING LAYER

(75) Inventors: Ramkumar Subramanian, Sunnyvale, CA (US); Christopher F. Lyons, Fremont, CA (US); Marina V. Plat, San Jose, CA (US); Scott A. Bell, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 56 days.

(21) Appl. No.: 09/884,834

(22) Filed: Jun. 19, 2001

(65) Prior Publication Data

US 2002/0061470 A1 May 23, 2002

Related U.S. Application Data (63) Continuation-in-part of application No. 09/716,217, filed on Nov. 21, 2000.

(51) Int. Cl.$^7$ .............................. G03F 7/00; H01L 21/00
(52) U.S. Cl. ........................ 430/312; 430/313; 430/317; 438/717
(58) Field of Search ................................ 430/312, 313, 430/317; 438/717, 723, 724, 725

(56) References Cited

U.S. PATENT DOCUMENTS

| | | | |
|---|---|---|---|
| 5,264,076 A | 11/1993 | Cuthbert et al. | 156/651 |
| 5,773,199 A | 6/1998 | Linliu et al. | 430/316 |
| 5,837,428 A | 11/1998 | Huang et al. | 430/313 |
| 5,858,621 A | 1/1999 | Yu et al. | 430/313 |
| 6,042,999 A | * 3/2000 | Lin et al. | 430/316 |
| 6,057,239 A | * 5/2000 | Wang et al. | 438/689 |
| 6,080,678 A | 6/2000 | Yim | 438/725 |
| 6,096,659 A | 8/2000 | Gardner et al. | 438/736 |
| 6,100,184 A | * 8/2000 | Zhao et al. | 438/638 |
| 6,136,679 A | 10/2000 | Yu et al. | 438/592 |
| 6,156,629 A | 12/2000 | Tao et al. | 438/535 |
| 6,204,168 B1 | * 3/2001 | Naik et al. | 438/638 |
| 6,218,079 B1 | * 4/2001 | Shin et al. | 430/314 |

OTHER PUBLICATIONS

S. Wolf, "Silicon Processing for the VLSI Era" vol. 1, 1990, p. 423, Lattice Press, Sunset Beach, California.

* cited by examiner

*Primary Examiner*—Mark F. Huff
*Assistant Examiner*—Kripa Sagar
(74) *Attorney, Agent, or Firm*—Foley & Lardner (57) ABSTRACT

A method of utilizing a multilayer photoresist to form contact holes and/or conductors utilizing a dual damascene process includes utilizing layered photoresists. A contact in a conductive line can be formed in a single deposition step or in a two-stage deposition step. Image layers can remain as part of the interconnect structure or be removed by a polishing technique. The process can be utilized for any conductive structures provided above a substrate of an integrated circuit.

20 Claims, 6 Drawing Sheets

DUAL DAMASCENE PROCESS UTILIZING A BI-LAYER IMAGING LAYER

CROSS REFERENCE TO RELATED APPLICATIONS

The present application is a continuation-in-part of U.S. patent application Ser. No. 09/716,217 entitled "Imaging Layer as Hard Mask for Organic Low-K Materials" filed by Subramanium et al. on Nov. 21, 2000 and assigned to the assignee of the present application.

FIELD OF THE INVENTION

The present specification relates generally to bi-layer photoresists. In particular, the present specification relates to a bi-layer photoresist process.

DESCRIPTION OF THE RELATED ART

Bi-layer photoresists and multilayer resists (MLR) have been utilized in photolithography. Typically, bi-layer resists are formed as follows. An organic layer is first spun onto a wafer containing underlayers. The organic layer typically has a thickness greater than the underlayers so that a smooth surface and substantially planar surface is provided. After pre-baking the organic layer, a thin imaging layer is deposited above the organic layer. High resolution patterns are created in the thin imaging layer using conventional photolithography techniques.

The higher resolution patterns are precisely transferred to the bottom organic layer using the imaging layer as a blanket exposure mask, or as an etching mask to pattern the organic layer. Patterns with resolutions less an 0.5 micrometers have been formed with such bi-layer resists. See, for example, R. Wolf, "Silicon Processing for the VLSI Era", Vol. 1, page 423.

Bi-layer and multilayer resists have been utilized to define various features including contacts or vias that electrically connect structures on an integrated circuit between interconnect layers (metal layers 1, 2, 3, 4 or 5). After defining the feature, the bi-layer or multilayer resist is stripped or removed from the substrate. Generally, the via extends between metal conductive lines between a conductive line and the semiconductor substrate (a silicide layer above the semiconductor substrate), between a polysilicon layer above the silicon substrate and a conductive or other structures.

According to one particular conventional lithographic process, conductive lines and vias are fabricated by a damascene process. In very and ultra-large scale integration (VLSI and ULSI) circuits, an insulating or dielectric material, such as silicon oxide, of the semiconductor device or IC is patterned in the damascene process with several thousand openings for the conductive lines and vias. The openings are filled with metal, such as aluminum or tungsten, and serve to interconnect the active and/or passive elements of the integrated circuit. The damascene process also is used for forming the multilevel signal lines of metal, such as copper, in the insulating layers, such as polyimide, of multilayer substrate on which semiconductor devices are mounted.

Damascene is an interconnection fabrication process in which grooves are formed in an insulating layer and filled with metal to form the conductive lines. Dual damascene is a multilevel interconnection process in which, in addition to forming the grooves of single damascene, the conductive via openings also are formed. In the standard dual damascene process, the insulating layer is coated with a resist material which is exposed to a first mask with the image pattern of the via openings, and the pattern is anisotropically etched in the upper half of the insulating layer. After removal of the patterned resist material, the insulating layer is coated with a resist material which is exposed to a second mask with the image pattern of the conductive lines in alignment with the via openings. In anisotropically etching the openings for the conductive lines in the upper half of the insulating material, the via openings already present in the upper half are simultaneously etched in the lower half of the insulating material. After the etching is complete, both the vias and grooves are filled with metal.

Dual damascene is an improvement over single damascene because it permits the filling of both the conductive grooves and vias with metal at the same time, thereby eliminating process steps. Although the standard dual damascene offers advantages over other processes for forming interconnections, it has a number of disadvantages, such as the edges of the via openings in the lower half of the insulating layer are poorly defined because of the two etchings and the via edges being unprotected during the second etching. Thus, improvements are needed in the standard dual damascene process to eliminate the poor edge definition of the via openings.

In addition, conventional dual damascene processes require that the dielectric layer be separately deposited before patterning begins. Further, conventional dual damascene processes require that at least two separate resist layers be completely stripped from the dielectric layer before conductive material is deposited.

Accordingly, there is a need for a bi-layer or multilayer resist process that can be utilized with a dual damascene technique. Further, there is a need of a dual damascene process utilizing a bi-layer or multilayer resist that can simultaneously form vias and conductive lines. Further still, there is a need for a simplified dual damascene process.

SUMMARY OF THE INVENTION

An exemplary embodiment relates to a method of forming dielectric material for conductive lines of an integrated circuit. The method includes forming a first lower, organic resist layer above a substrate, forming a first upper, silicon-containing resist layer above the first lower layer, patterning a first upper layer using a first etchant selective to the first upper layer with respect to the first lower layer to thereby form patterned first upper layer, and patterning the first lower layer using the patterned first upper layer as a hard mask and using a second etchant selective to the first lower layer with respect to the first upper layer. The first lower layer and the first upper layer correspond to a first layered resist. The method also includes a second lower, organic resist layer above the first upper, silicon-containing resist layer, forming a second upper, silicon-containing resist layer above the second lower layer, patterning the second upper layer using the first etchant selective to the second upper layer with respect to the second lower layer to thereby form a patterned second upper layer, and patterning the second lower layer using the patterned second upper layer as a hard mask using the second etchant selective to the second lower layer with respect to the second upper layer.

Another exemplary embodiment relates to a method of forming dielectric material for conductive lines of an integrated circuit. The method includes depositing a first layered photoresist above a substrate, the first layered photoresist including a first lower layer and a first upper layer, patterning the first upper layer using a first etchant selective to the first upper layer with respect to the first lower layer to thereby form a patterned first upper layer, and patterning the first lower layer using the patterned first upper layer as a hard mask and using a second etchant selective to the first lower layer with respect to the second upper layer. The method also includes depositing a second layered photoresist onto a substrate, the second layered photoresist including a second lower layer and a second upper layer, patterning the second upper layer using the first etchant selective to the second upper layer with respect to the second lower layer to thereby form a patterned second upper layer, and patterning the second lower layer using the patterned second upper layer as a hard mask and using a second etchant selective to the second lower layer with respect to the second upper layer.

Another exemplary embodiment relates to an integrated circuit. The integrated circuit includes an interconnect structure, the interconnect structure including a first surface and a second surface. The interconnect structure including a first dielectric layer and a second dielectric layer, wherein the first dielectric layer is at least part of first layered photoresist and the second dielectric layer is at least part of a second layered photoresist.

BRIEF DESCRIPTION OF THE DRAWINGS

The embodiments of the present invention will become more fully apparent from the following detailed description when read in conjunction with the accompanying drawings with like reference numerals indicating corresponding parts throughout, wherein.

DETAILED DESCRIPTION OF THE PREFERRED EMBODIMENTS

The semiconductor fabrication industry is moving to organic, low-k materials as dielectrics, from conventional silicon dioxide as a low-k dielectric. As such, an exemplary embodiment utilizes properties of a layered (bi-layered or multilayered) resist in a novel manner, to provide for formation of semiconductor structures having small critical dimensions.

As explained earlier, a multi-layered resist such as a bi-layer resist has a top layer, which can be an imaging layer and which can be a silicon-containing layer. The bi-layer resist also has a bottom layer which is an organic resist. In an embodiment of the invention, the bottom organic layer may be a bottom anti-reflective coating (BARC) layer, a SILK (silicon-containing low-k) layer, a FLARE layer, or a BCB layer, for example. Other types of low-k organic layers may be utilized for forming the bottom layer of the bi-layer resist. A typical thickness of the bottom organic layer is between 1000–15000 Å. The bottom organic layer typically has a dielectric constant of between 2 and 4.5.

The top imaging layer is a very thin layer, and is a layer on which light or radiation impinge upon to form an image. A typical thickness of the imaging layer is between 400 Å and 2000 Å.

To create the multilayer resist, the top imaging layer is formed after the bottom organic layer is formed. A bi-layer resist that may be utilized in the present invention can be any one of the following products made by Arch Corporation: OiR620, OiR906, OiR908. Of course, bi-layer resists made by other companies may be utilized while remaining within the scope of the invention. However, unlike the conventional uses of this product, the bi-layer resist is not completely removed after it has been utilized to form a pattern, but rather portions of it (or all of it) remain in the semiconductor device to act as dielectric layers between conductive layers.

Typically, a bi-layer resist is used to form patterns, where the top imaging layer of the bi-layer resist has very different etch properties as compared to layers beneath the bi-layer resist (underlayers). As explained earlier, the top imaging layer is very thin, so that the top imaging layer does not cause any significant focus shifts during a photolithographic process. Once the top imaging layer has been patterned by exposing portions of it to light (through a mask, for example) and then to a developer, it can be used as an etch mask for etching underlayers. The light-exposed portions of the top imaging layer are removed by subjecting the top imaging layer to tetramethyl ammonium hydroxide (TMAH), for example. This forms a desired pattern on the top imaging layer, as seen in FIG. 1b, for example.

Since the bottom layer of the bi-layer resist is organic, and since the top layer of the bi-layer resist is silicon-containing, they have very different etch properties, and thus the etch chemistry or method used is selected to etch the top imaging layer of the bi-layer resist without significantly etching the bottom organic layer of the bi-layer resist. Also, a different etch chemistry is used to etch the bottom organic layer (in accordance with the pattern formed on the top imaging layer) without significantly etching the top silicon-containing imaging layer.

Once the top and bottom layers have both been patterned to a desired pattern, the top imaging layer may be removed or left in place. The bi-layer resist acts as a hard mask for etching any layers underneath the bottom organic layer, such as, for example, a silicon dioxide layer. The use of the bottom organic layer as a hard mask is possible due to the different etch chemistries involved in etching that layer and the layers beneath it. That is, a pattern can be formed in a silicon dioxide layer formed beneath the lower layer of the bi-layer resist. An etchant that can be used for etching the bottom organic layer is an oxygen plasma, for example.

Once the bottom organic layer is patterned to form contact holes, trenches or vias to lower conductive layers, the top imaging layer can be left on the semiconductor device, or it can be polished back so as to remove it from the semiconductor device. If left on the semiconductor device, the top imaging layer forms a dirty oxide layer, which actually serves as a useful dielectric layer in the present invention.

In another exemplary embodiment, the top imaging layer of the bi-layer resist is used as a hard mask for etching patterns in the bottom organic layer of the bi-layer resist. The patterned bottom organic layer, as a low-k dielectric layer, remains within the semiconductor device formed on the substrate. This is unlike the conventional uses of a bi-layer resist in which the bi-layer resist is removed from the semiconductor device after the resist has been utilized to form contact holes, vias, trenches or the like on the semiconductor device.

In yet another exemplary embodiment, only the silicon-containing top imaging layer is patterned in a first step, by first exposing portions of the top imaging layer to light and then subjecting the top imaging layer to a developer, such as TMAH.

Figure 1A:
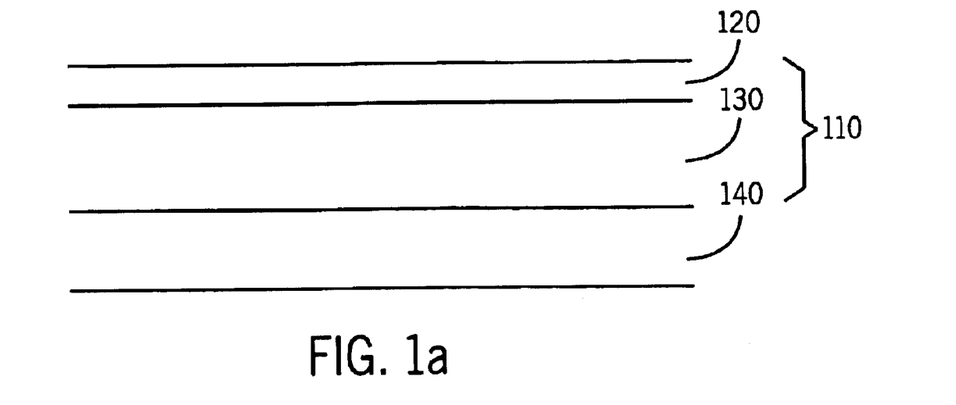
FIG. 1(a) is a cross-sectional view of a substrate or semiconductor layer including a bi-layer photoresist in accordance with an exemplary embodiment of a fabrication process.
Figure 1B:
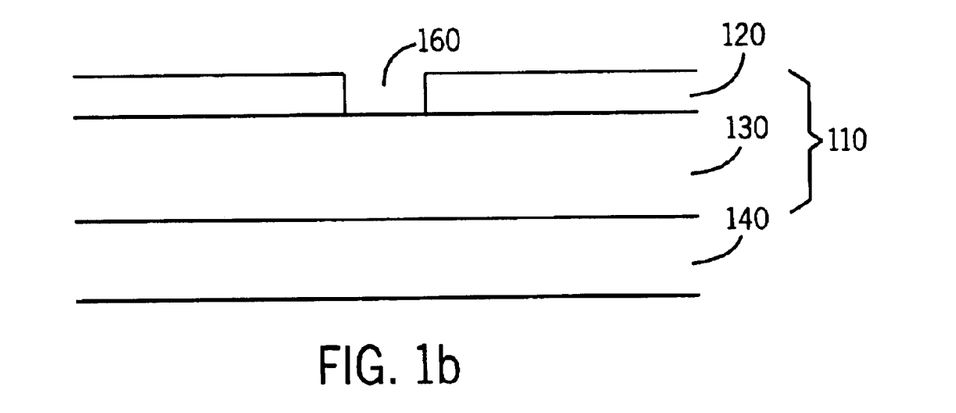
FIG. 1(b) is a cross-sectional view of the portion of the layer illustrated in FIG. 1(a), showing a first patterning step of the fabrication process.

FIG. 1(a) shows a semiconductor device with a multi-layer resist embodied as bi-layer resist 110 formed thereon. The bi-layer resist 110 includes a top imaging layer 120 and a bottom organic layer 130. Bi-layer resist 110 is formed on top of an underlayer 140, which may be positioned on further underlayers, such as substrate 150 (not shown). FIG. 1(b) shows the semiconductor device after top imaging layer 120 of bi-layer resist 110 has been patterned, so as to form a hole 160. The etch chemistry chosen is etch sensitive to top imaging layer 120, but is etch resistant to bottom organic layer 130. In other words, layer 120 is not etch resistant to the etch chemistry and layer 130 is etch resistant to the etch chemically. Thus, the organic-containing bottom layer 130 of the bi-layer resist 110 is not etched at this time (i.e., the TMAH developer does not affect bottom organic layer 130).

Since top imaging layer 120 of the bi-layer resist 110 is a thin layer, it is advantageous for imaging (little if any focus shifting occurs), and a precise pattern can be made on that layer. The organic-containing bottom layer 130 is then etched with a second etchant, using the patterned silicon-containing top layer as a hard mask.

Figure 1C:
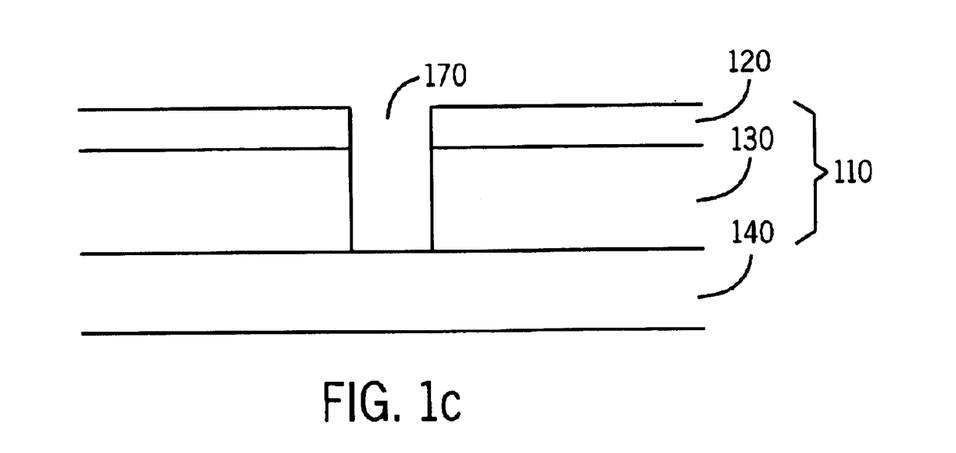
FIG. 1(c) is a cross-sectional view of the layer illustrated in FIG. 1(b), showing a second patterning step of the fabrication process.

FIG. 1(c) shows the semiconductor device after organic containing bottom layer 130 has been etched, thereby forming a hole 170 that extends through the top imaging layer 120 and the bottom organic layer 130, all the way down to underlayer 140. The etchant used to etch the organic-containing bottom layer 130 is highly selective, and thus does not etch the patterned top imaging layer of the bi-layer resist. Further, where underlayer 140 is a non-organic underlayer 140 (e.g., a titanium silicide layer), it will be likewise etch-resistant to the organic bottom layer 130. As explained above, the second etchant for performing this type of etching of the organic-containing lower layer (and which does not etch the silicon-containing layers) is an oxygen plasma, for example.

Also, since the silicon-containing top imaging layer 120 becomes a "dirty" oxide layer when the bottom organic layer 130 is etched, it can be removed by polishing it instead of stripping it off, if desired. The dirty oxide is formed since some of the oxygen plasma used during the etch reacts with the silicon in the silicon-containing top imaging layer 120, thereby forming a silicon-oxygen-containing top imaging layer.

Afterwards, plugs may be formed in the contact holes, and a conductive layer (now shown in the figures) can be formed on top of the patterned bi-layer resist 110, whereby the conductive materials in the contact holes formed in organic lower layer 130 of patterned bi-layer resist 110 provide electrical contacts between a conductive layer formed above and a conductive layer (such as underlayer 140) formed below the patterned bi-layer resist 110. That is, a conductive material such as copper or aluminum can be disposed within the contact holes to form an electrical path between the top and bottom conductive layers. Besides contact holes, trenches or vias may be alternatively formed in the bottom organic layer of the bi-layer resist to form conductive paths to lower layers of the semiconductor device.

Figure 2:
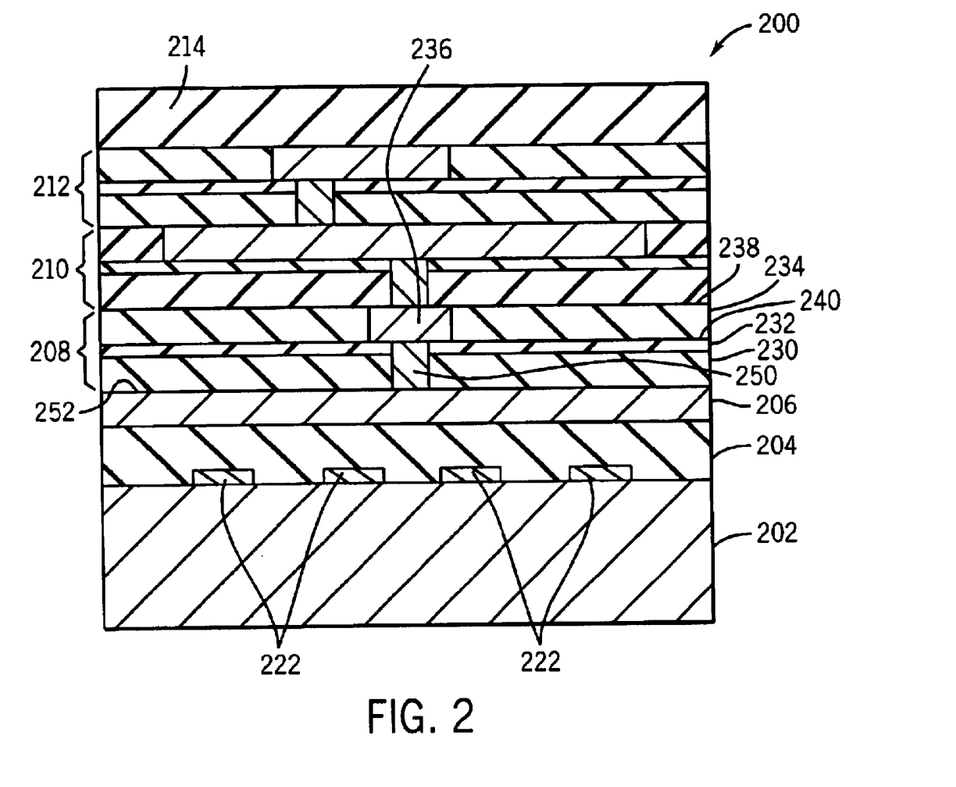
FIG. 2 is a cross-sectional view of a portion of an integrated circuit including interconnect structures in accordance with another exemplary embodiment.

With reference to FIG. 2, a portion 200 of an integrated circuit includes a substrate 202, a dielectric layer 204, a conductive layer 206, an interconnect structure 208, an interconnect structure 210, an interconnect structure 212 and a dielectric layer 214. Although shown with three interconnect structures 208, 210 and 212, portion 200 can have any number of interconnect structures.

Substrate 202 can be any suitable substrate for integrated circuit fabrication including a semiconductor substrate embodied as a silicon wafer. Substrate 202 can house various types of passive or active devices including transistors 222. Transistors 222 are insulated by an insulating layer 204 of silicon dioxide from conductive layer 206. Alternatively, compound layers of insulating materials can be utilized.

Conductive layer 206 is preferably a conductive line, such as an aluminum line or a polysilicon line provided above layer 204. Alternatively, layers 204 and 206 can be replaced by an interconnect structure similar to structure 208.

Interconnect structure 208 can be a local interconnect structure or an interconnect structure or a metal layer. Structure 208 preferably includes a bottom dielectric layer 230, a middle dielectric layer 232 and a top dielectric layer 234. A conductive line 236 (a trench conductor) is provided in dielectric layer 234. Conductive line 236 can be an aluminum, tungsten, copper or other conductive material suitable for electrically coupling signals through portion 200. Various conductive materials and alloys of conductive material can be used for conductive line 236.

Conductive line 236 extends from a top surface 238 to a bottom surface 240 of layer 234. Preferably, conductive line 236 does not extend into middle dielectric layer 232.

A conductive via 250 extends from bottom surface 240 of layer 234 to a bottom surface 252 of layer 230. Via 250 makes an electrical contact between line 236 and layer 206. Via 250 can be an aluminum, tungsten, copper or other conductive material.

Interconnect structures 210 and 212 are substantially similar to layer 208. Structures 208, 210 and 212 can correspond to conventional metal layers (metal 1, metal 2, metal 3) associated with conventional integrated circuit structures. The particular configuration illustrated in FIG. 2 is not shown in a limiting fashion. For example, the widths and shapes of various conductive lines (line 236) and conductive vias (via 250) can be adjusted. Further, the pattern for portion 200 can be manipulated into various configurations necessary for integrated circuit design.

Interconnect structure 208 advantageously includes insulative layers based upon a layered photoresist. The advantageous manufacturing process for portion 200 is described below with reference to FIGS. 2–9 for a first exemplary embodiment of a dual damascene process and FIGS. 2–5 and 10–15 for second exemplary embodiment of a dual damascene process. Interconnect structure 208 utilizes a dual damascene process in which layers 230, 232 and 234 are products of multilayer photoresists. Holes for via 250 and trenches for conductive line 236 are formed by patterning layers 230, 232 and 234 of the multilayer photoresists.

Figure 3:
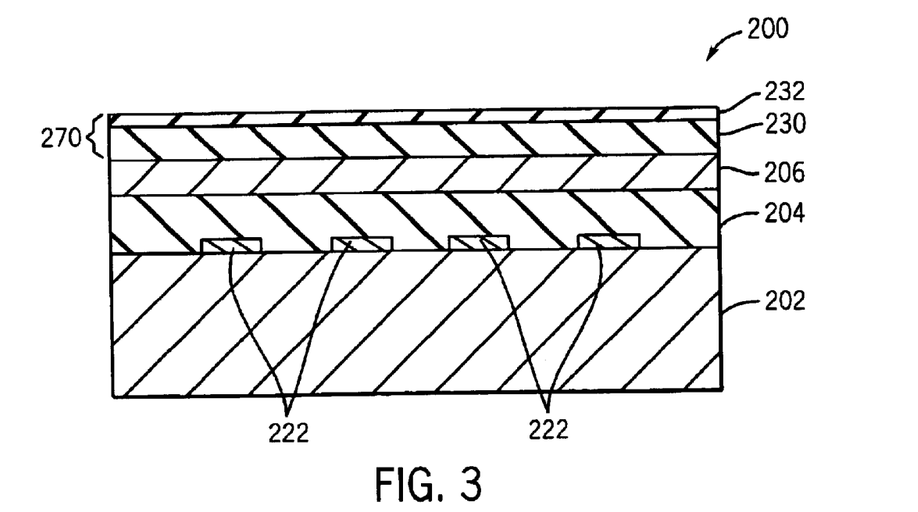
FIG. 3 is a cross-sectional view of the portion illustrated in FIG. 2, showing a first bi-layer photoresist application step in accordance with an exemplary embodiment of a first contact fabrication process.

In FIG. 3, portion 200 includes transistors 222 formed by any suitable process on substrate 202. An insulative layer, such as layer 204, can be deposited by tetraethylorthosilicate (TEOS) deposition to a thickness of 3,000–5,000 Å over transistors 222. A conductive line or layer 206 can be provided by chemical vapor deposition (CVD) or sputter deposition above layer 204.

Layers 204 and 206 can also be formed utilizing the process described with reference to FIGS. 2–9 as an interconnect structure similar to interconnect structure 208. Conductive line 206 can be a patterned conductive material, such as, doped polysilicon or metal, (e.g., copper, titanium, aluminum, or compounds thereof). A layered photoresist 270 is provided above layer 206. Layered photoresist 270 can be a bi-layered photoresist including a lower layer 230 and an upper layer 232. Upper layer 232 can be similar to layer 120 described with reference to FIGS. 1(a)–(c) and layer 230 can be a lower layer similar to layer 130 described with reference to FIGS. 1 (a)–(c). Preferably, layer 230 is 4000–6000 Å thick layer of organic underlayer and layer 232 is a 1000–3000 Å thick layer of silicon containing resist.

Figure 4:
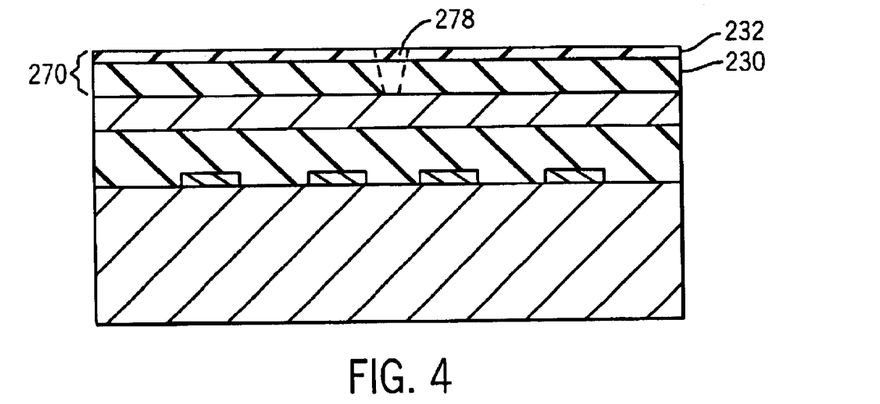
FIG. 4 is a cross-sectional view of the portion illustrated in FIG. 3, showing a first photolithographic patterning step of the first contact fabrication process.

With reference to FIG. 4, layered photoresist 270 is lithographically patterned to form an area 278 associated with via 250 (FIG. 2). Photoresist 270 can be patterned by providing radiation reflected from a reticle or provided through a photomask. Any patterning process can be utilized to form area 278.

Figure 5:
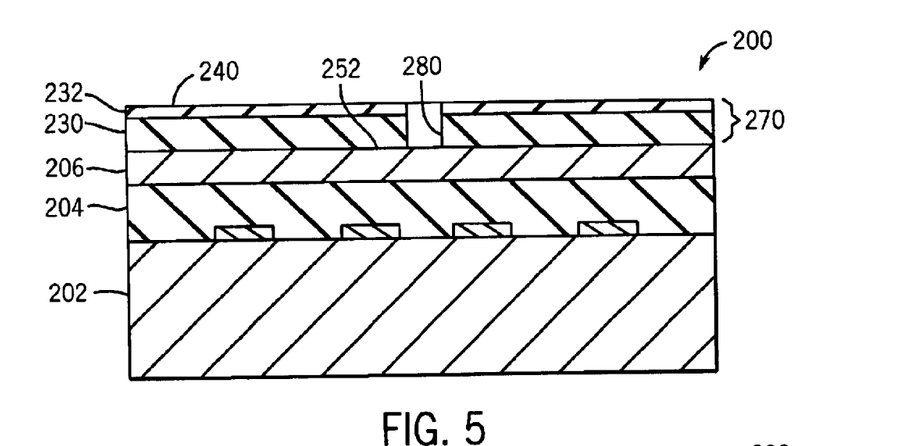
FIG. 5 is a cross-sectional view of the portion illustrated in FIG. 4, showing a first patterning step of the first contact fabrication process.

In FIG. 5, after area 278 (FIG. 4) is formed, layers 230 and 232 are etched similar to layers 120 and 130 (FIGS. 1(a)–(c)). An aperture 280 associated with area 278 (FIG. 4) is provided through layers 230 and 232. Preferably, aperture 280 has a width of 250 nm or smaller.

Aperture 280 can be square-shaped, rectangular-shaped, or circular. Aperture 280 extends from surface 240 to surface 252. Preferably, aperture 280 extends to a conductive region or layer such as layer 206.

Figure 6:
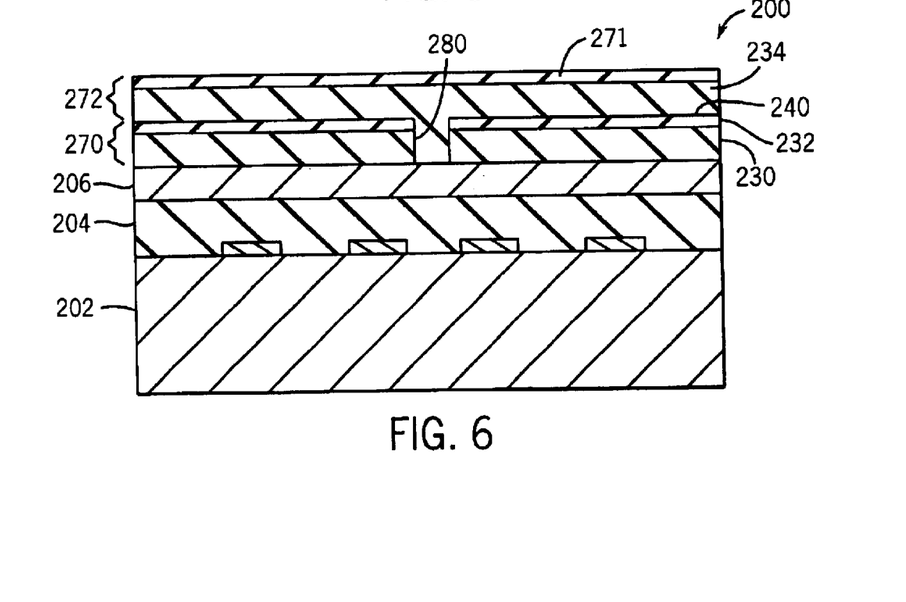
FIG. 6 is a cross-sectional view of the portion illustrated in FIG. 5, showing a second bi-layer photoresist application step of the first contact fabrication process.

With reference to FIG. 6, a layered photoresist 272 is provided above bi-layer photoresist 270. Layered photoresist 272 is substantially similar to photoresist 270. Photoresist 272 preferably fills aperture 280. Photoresist 272 includes an upper layer 271 similar to layer 232 and a lower layer 234 similar to layer 230. Preferably, layer 234 is a 4000–6000 Å thick layer of organic underlayer, and layer 271 is a 1000–3000 Å thick layer of silicon containing resist.

Figure 7:
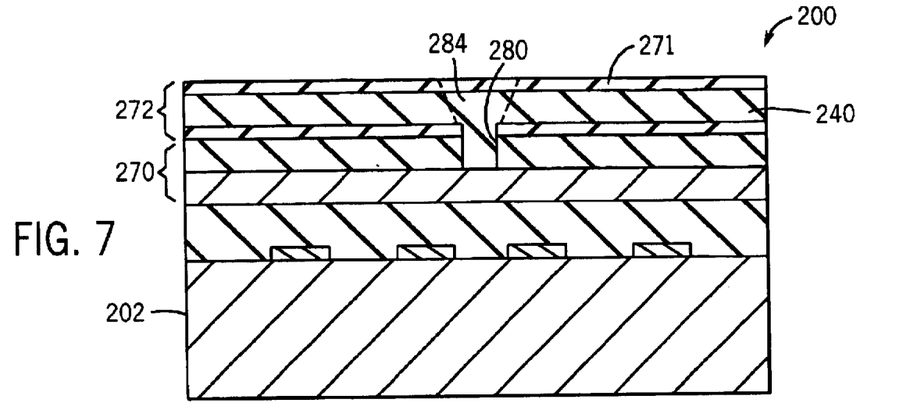
FIG. 7 is a cross-sectional view of the portion illustrated in FIG. 6, showing a second photolithographic patterning step of the first contact fabrication process.

With reference to FIG. 7, photoresist 272 is patterned to form a region 284 above aperture 280. Preferably, region 284 covers aperture 280.

Figure 8:
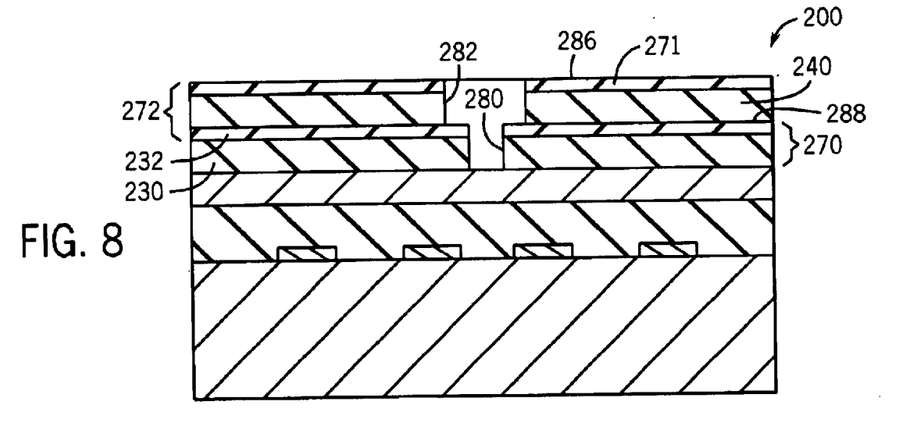
FIG. 8 is a cross-sectional view of the portion illustrated in FIG. 7, showing a second dual etching step of the first contact fabrication process.

With reference to FIG. 8, an aperture or trench 282 is etched through bi-layer photoresist 272 from a surface 286 to a surface. Preferably, aperture 282 is for a trench conductor or conductive line such as line 236 (FIG. 2). Aperture 282 preferably has a greater surface area than aperture 280 (via 250 in FIG. 2). In one embodiment, aperture 282 can be 250 nm or smaller Å wide and aperture 280 can be 250 nm or smaller wide.

Figure 9:
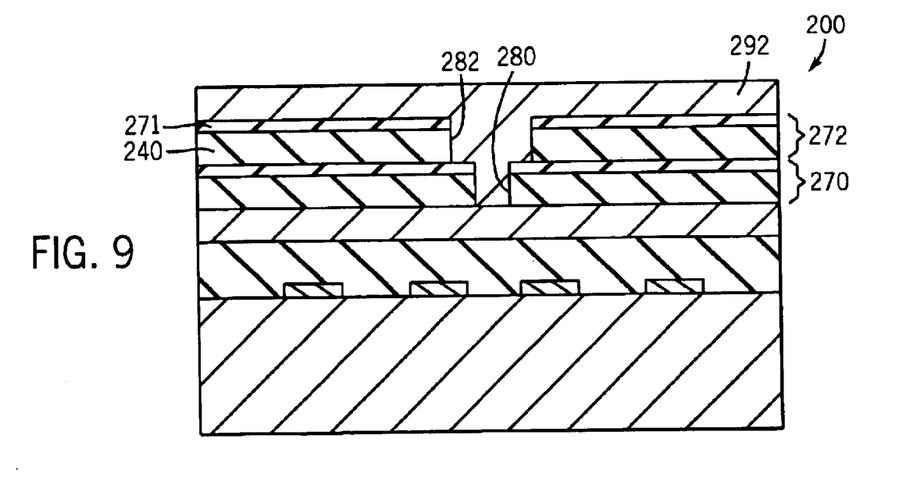
FIG. 9 is a cross-sectional view of the portion illustrated in FIG. 8, showing a conductive material deposition step of the first contact fabrication process.

With reference to FIG. 9, a conductive material 292 is deposited above bi-layer photoresist 272. Material 292 can be deposited by sputter deposition or chemical vapor deposition (CVD) and fills both apertures 282 and 280. Accordingly, the process described with reference to FIGS. 2–9 advantageously provides conductive material for conductive line 236 and conductive via 250 (FIG. 2) in one step.

After the deposition of layer 292, layer 292 is etched or polished thereby leaving material 292 in apertures 282 and 280 as conductive line 236 and conductive via 250 (FIG. 2). The polishing can remove dielectric layer 271 of photoresist 272. Preferably, the polishing technique is selective to material 292 and can be a CMP process.

As shown in FIG. 2, interconnect structures 210 and 212 can be provided above interconnect layer 208 according to the process described with reference to FIGS. 2–9.

Figure 10:
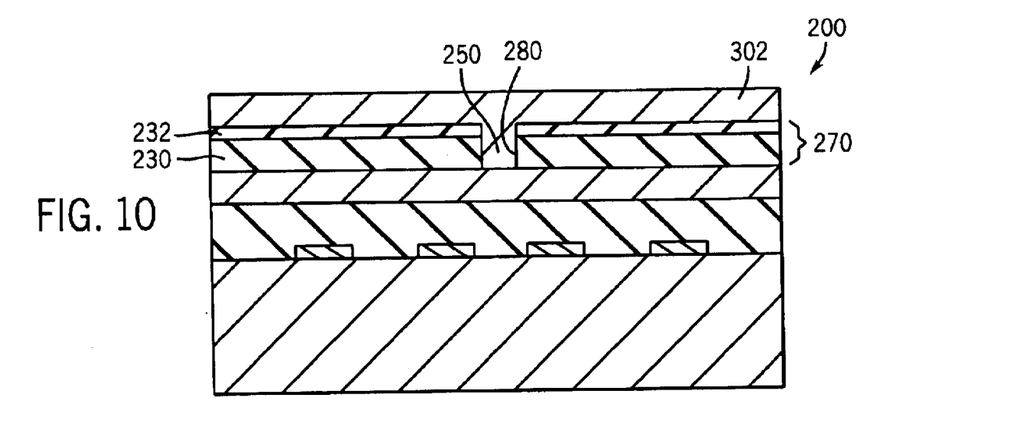
FIG. 10 is a cross-sectional view of the portion of the integrated circuit illustrated in FIG. 5, showing a conductive layer deposition step in accordance with an exemplary embodiment of a second contact fabrication process.

With reference to FIGS. 2–5 and 10–15, a second process for forming interconnect layer 208 is described. The second process is substantially similar to the first process for the steps described with reference to FIGS. 3–5. In FIG. 10, aperture 280 is filled with conductive material 302. Conductive material 302 is substantially similar to material 292 (FIG. 9) and is deposited by CVD or spatter deposition.

Figure 11:
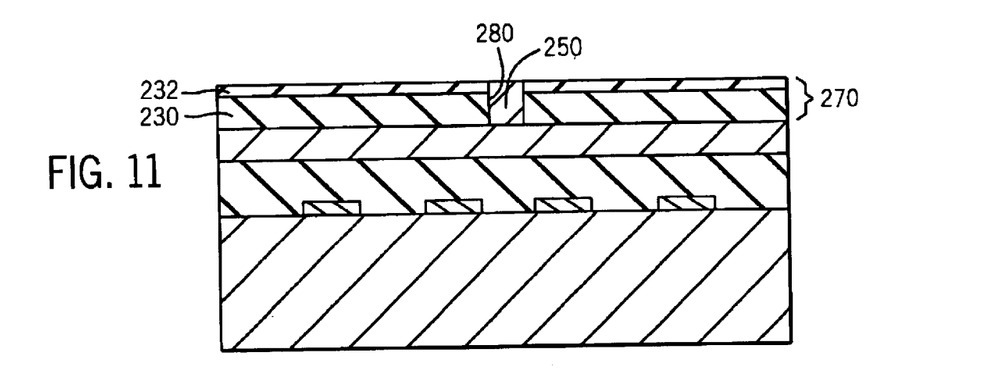
FIG. 11 is a cross-sectional via of the portion illustrated in FIG. 10 showing a polish step in accordance with the second contact fabrication process.

In FIG. 11, material 302 (FIG. 10) is subjected to a polishing process similar to the polishing process described with reference to FIGS. 9 and 2. The polishing process removes layer 302 from above interconnect layer 270, thereby leaving via 250 in aperture 280. In an alternative embodiment, the polishing process can also remove layer 232, if desired.

Figure 12:
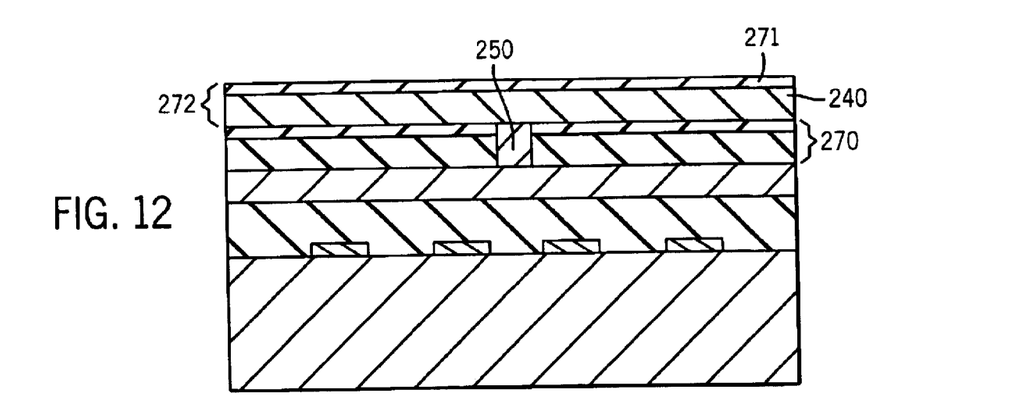
FIG. 12 is a cross-sectional view of the portion of the integrated circuit illustrated in FIG. 11, showing a second bi-layer photoresist deposition step in accordance with the second contact fabrication process.
Figure 13:
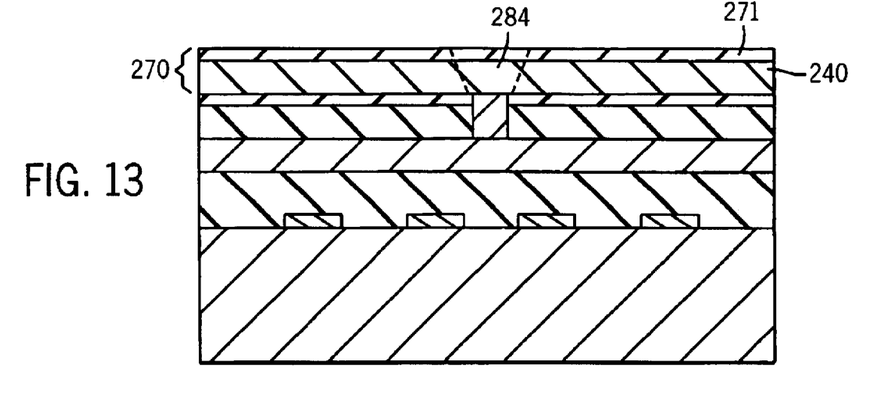
FIG. 13 is a cross-sectional view of a portion of the integrated circuit illustrated in FIG. 12, showing a second patterning step in accordance with the second contact fabrication process.
Figure 14:
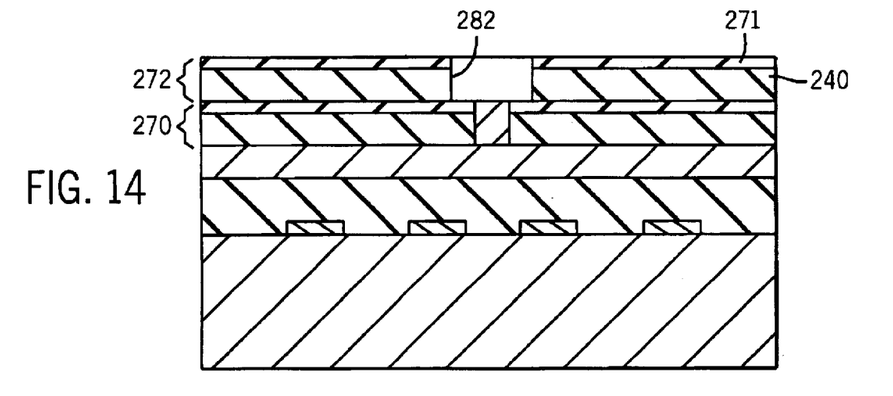
FIG. 14 is a cross-sectional view of the portion illustrated in FIG. 13, showing a second removal step in accordance with the contact fabrication process.

With reference to FIG. 12, photoresist 272 is provided above photoresist 270 and via 250. Photoresist 272 is similar to photoresist 272 discussed with reference to FIGS. 7–9. In FIG. 13, photoresist 272 is patterned according to the process described with reference to FIG. 7. In FIG. 14, photoresist 272 is etched in accordance with the process described with reference to FIG. 8 to provide aperture 282.

Figure 15:
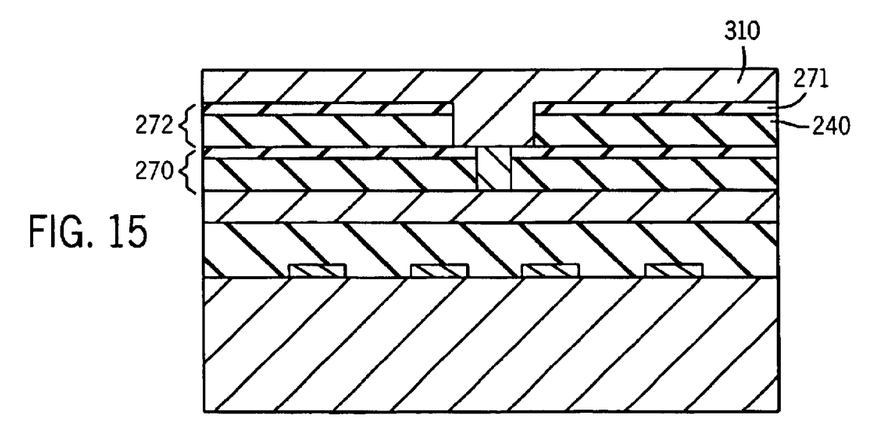
FIG. 15 is a cross-sectional view of the portion of the integrated circuit illustrated in FIG. 14, showing a conductive layer deposition step in accordance with the second fabrication process.

In FIG. 15, a conductive material 310 is provided in aperture 282 (FIG. 14)in photoresist layer 272. Layer 310 is substantially similar to layer 292 described with reference to FIG. 9. After deposition, layer 310 is polished to remove material 310 and complete interconnect layer 208 (as shown in FIG. 2).

Interconnect structures 210 and 212 can be formed above structure 208. Substantially similar processing steps described with reference to FIGS. 2–5 and 10–15 can be used for structures 210 and 212.

While there has been illustrated and described what is at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best mode contemplated for carrying out the invention, but that the invention will include all embodiments falling within the scope of the appended claims.

What is claimed is:

1. A method of forming dielectric material for conductive lines of an integrated circuit, the method comprising:
   a forming a first lower, organic resist layer above a substrate;
   forming a first upper, silicon-containing resist layer above the first lower layer, wherein the first lower layer and the first upper layer correspond to a first layered resist;
   patterning the first upper layer using a first etchant selective to the first upper layer with respect to the first lower layer to thereby form a patterned first upper layer including a first aperture;
   patterning the first lower layer using the patterned first upper layer as a hard mask using a second etchant selective to the first lower layer with respect to the first upper layer to form a second aperture;
   forming a second lower, organic resist layer above the first upper, silicon-containing resist layer and filling the first aperture and the second aperture with the second lower organic resist layer;
   forming a second upper, silicon-containing resist layer above the second lower layer, wherein the second lower layer and the second upper layer correspond to a second layered resist;
   patterning the second upper layer using the first etchant selective to the second upper layer with respect to the second lower layer to thereby form a patterned second upper layer; and
   patterning the second lower layer using the patterned second upper layer as a hard mask using the second etchant selective to the second lower layer with respect to the second upper layer.

2. The method according to claim 1, further comprising: removing the second upper layer.

3. The method according to claim 2, wherein the second upper layer is removed by a stripping process.

4. The method according to claim 2, wherein the second upper layer is removed by a polishing process.

5. The method according to claim 1, further comprising: wherein the patterning the first upper layer and the first lower layer steps forms the first aperture and the second aperture for a via.

6. The method according to claim 5, wherein the patterning the second upper layer and the patterning the second lower layer a step form a trench for a conductive line.

7. A method of forming dielectric material for conductive lines of an integrated circuit, the method comprising:
   depositing a first layered photoresist above a substrate, the first layered photoresist including a first lower layer and a first upper layer;
   patterning the first upper layer to thereby form a patterned first upper layer including a first aperture;
   patterning the first lower layer using the patterned first upper layer as a hard mask to form a second aperture;
   depositing a second layered photoresist above the first layered photoresist, the second layered photoresist including a second lower layer and a second upper layer, the second lower layer being deposited in the second aperture;
   patterning the second upper layer to thereby form a patterned second upper layer; and
   patterning the second lower layer using the patterned second upper layer as a hard mask.

8. The method according to claim 7, further comprising: removing the first upper layer.

9. The method according to claim 8, wherein the upper layer is removed by a stripping process.

10. The method according to claim 8, wherein the upper layer is removed by a polishing process.

11. The method according to claim 7, further comprising:
    forming a first conductive layer beneath the first lower layer; and
    wherein the patterning of the first lower layer comprises forming at least one via.

12. The method according to claim 11, wherein the patterning the second lower layer comprises:
    forming at least one trench for a conductive line.

13. A process for forming an integrated circuit, the integrated circuit comprises an interconnect structure including a first surface and a second surface and a second surface, the interconnect structure including a first dielectric layer and a second dielectric layer, the process comprising:
    forming a first lower resist layer above a substrate;
    forming a first upper resist layer above the first lower resist layer, wherein the first lower resist layer and the first upper resist layer correspond to a first layered photoresist;
    patterning the first upper resist layer to thereby form a patterned first upper resist layer having a first aperture;
    patterning the first lower resist layer using the patterned first upper resist layer as a hard mask to form a second aperture in the first lower resist layer;
    forming a second lower resist layer above the first upper resist layer and within the second aperture;
    forming a second upper resist layer above the second lower resist layer, wherein the second lower resist layer and the second upper resist layer correspond to a second layered photoresist;
    patterning the second upper resist layer to thereby form a patterned second upper resist layer; and
    patterning the second lower resist layer using the patterned second upper layer as a hard mask, thereby removing the second lower resist layer from the second aperture in first lower layer, wherein the first dielectric layer includes, is part of or is the first layered photoresist and the second dielectric includes, is part of or is the second layered photoresist.

14. The process of claim 13, wherein the interconnect structure includes a thin oxide-containing layer between the first dielectric layer and the second dielectric layer, the thin oxide-containing layer including or being the first upper resist layer.

15. The process of claim 14, wherein the oxide-containing layer is an imaging layer containing silicon.

16. The process of claim 13, further comprising:
a conductive via extending through the second dielectric layer.

17. The process of claim 16, further comprising:
a conductive line extending through the first dielectric layer and electrically coupled to the via, the conductive line having a significantly greater area than the via.

18. The process of claim 16, wherein the interconnect structure includes a middle layer between the first dielectric layer and the second dielectric layer, the contact extending through the middle layer, the conductive line not extending through the middle layer, the middle layer being or including the first upper resist layer.

19. The process of claim 18, wherein the via includes copper.

20. The process of claim 13, wherein the first dielectric layer is a low-k dielectric layer.

* * * * *